United States Patent
Brill et al.

[11] 3,936,545
[45] Feb. 3, 1976

[54] METHOD OF SELECTIVELY FORMING OXIDIZED AREAS

[75] Inventors: Klaus Brill, Korntal; Christian Glassman, Stuttgart, both of Germany

[73] Assignee: Robert Bosch G.m.b.H., Stuttgart, Germany

[22] Filed: Oct. 31, 1972

[21] Appl. No.: 302,629

[30] Foreign Application Priority Data
Dec. 3, 1971  Germany............................ 2160008

[52] U.S. Cl. ................. 427/343; 427/99; 427/162; 427/250; 427/258; 427/282; 427/294; 427/350; 427/367; 427/404
[51] Int. Cl.² ................. C23C 11/00; C23C 13/00
[58] Field of Search ........ 156/4, 6, 7; 117/212, 106, 117/62, 119; 427/162, 250, 258, 282, 294, 333, 343, 350, 367, 404, 99

[56] References Cited
UNITED STATES PATENTS

| | | | |
|---|---|---|---|
| 2,702,259 | 2/1955 | Sommer............................ | 117/106 R |
| 3,306,788 | 2/1967 | Sterling et al................... | 117/200 X |
| 3,406,036 | 10/1968 | McGrath et al. ............... | 117/106 X |
| 3,472,688 | 10/1969 | Hayashi et al. ................... | 117/212 |
| 3,637,377 | 1/1972 | Hallman et al. .................... | 156/4 X |
| 3,647,508 | 3/1972 | Gorrell................................. | 156/7 X |
| 3,801,366 | 4/1974 | Lemelson........................... | 117/212 |

*Primary Examiner*—William A. Powell
*Attorney, Agent, or Firm*—William R. Woodward

[57] ABSTRACT

A vapor deposited aluminum metallizing film is transformed into a transparent insulating oxide at selective locations at which a film of bismuth or sodium is vapor deposited either beforehand on the substrate or afterward on the aluminum. The oxide forms at only the selected locations to the full depth of the layer and has insulating qualities of interest for electrical components. The use of a pigmented substrate which will show through the transparent oxide areas is useful for providing visible legends, symbols, scales, and reference margins, marks or rasters.

16 Claims, 7 Drawing Figures

METHOD OF SELECTIVELY FORMING OXIDIZED AREAS

This invention relates to thin film material or devices having a metallic film on a carrier substrate in which selected areas of the metallic film are oxidized and methods and apparatus for producing the same.

Various thin film processes and products are known in which, on vapor deposited surfaces, geometrical designs, legends or symbols are isolated or are formed by gaps in the film. The methods for producing such patterns heretofore used are, on the one hand, vapor deposition through a physical stencil which covers the surfaces to be kept free of the film, on the other hand by depositing a continuous layer and thereafter covering the parts of the layer that are to remain and etching away of the parts to be removed, and finally, the prevention of condensation of the layer to be deposited in certain places to be kept free of deposit by means of a thin layer of oil applied in certain portions on the substrate before vapor deposition.

The first of these methods, to wit vapor deposition through a mechanical stencil, is unsuited for many applications, particularly for applying complicated patterns on sheet or tape material, because mechanical stencils must be provided with connecting webs which result in undesired gaps in the layer pattern on the completed article. The second method, involving subsequent covering of the portions of the layer that are to remain and etching away the portions to be removed is really suitable only for material in the form of stiff plates, for example for the production of printed circuits. A series of process steps is necessary, which greatly limits for economic reasons the scope of application of the process. The third known process mentioned above, involving the provision of an oil layer previous to vapor deposition is not suitable for all kinds of vapor deposition layers. If, for example, an aluminum layer is to be deposited, a very heavy oil layer must be provided to prevent the condensation of aluminum on the carrier because of the high condensability of aluminum vapor. Such a heavy oil layer necessarily produces poorly defined contours.

The object of the invention is to provide a metallized substrate with selectively oxidized regions which is more satisfactory and more easily produced and to devise a process and apparatus for producing it. In particular the object is to provide a process involving only a few operations and one which will enable the manufacture of stable oxidized regions with sharp contours. A further object is to provide a process that lends itself well to continuous vapor deposition on a flexible tape substrate and one which is usable for the provision of any desired contours, such as, for example, line patterns, symbols, firm names, insulating boundary lines in printed circuits or the like.

Subject matter of the present invention: Briefly, the oxidized areas of the metallic layer are produced by local corrosion. It has been found that such local corrosion can be selectively promoted by local application in a suitable pattern of at least one material adapted to incite corrosion of the metal layer. The resulting pattern of corroded material may be used to provide an optically or electrically detectable pattern for recognition or registration purposes or the like or to provide an electrically insulating layer or an electrically insulating division of the entire metallic layer at the location on the carrier of the corroded material.

The corrosion or similar layer transformation can be provided by various mechanisms, individually or concurrently. Thus, the corrosion inciting material can be applied on the substrate so as to modify locally the growth conditions of the vapor deposited layer. Such a changed layer structure, however, also has other corrosion phenomena as consequences. According to the position of the additive material in the electro-chemical potential series, the progress of corrosion can be substantially accelerated by the formation of corrosion current. Finally, a layer of transformation and accentuated corrosion can also be initiated by a chemical reaction between the materials brought together, either directly or with intermediate steps.

According to the nature and form of the particular application in question, of the corrosion inciting material and of the apparatus used, it can be advantageous to apply the corrosion inciting material in vacuum either before or after the vapor deposition of the metal layer. It is especially practical to apply the corrosion inciting material onto the carrier in a vapor deposition process separate from the process of the vapor deposition of the metallic layer. Bismuth is particularly suitable as a corrosion inciting material for corroding an aluminum layer, but sodium is also usable to advantage as such a corrosion inciting material.

If the optical properties of the corroded layer portions are to be utilized in reflective light, it is advantageous to apply a colored layer directly on the carrier and then so to choose the thickness and materials for the corroded areas that the colored layer will be visible through the corroded layer. In this manner, an optically detectable pattern can be simply and conveniently produced. The provision of a corroded layer, such that the colored layer can be visible through it, is readily feasible because thin metal oxide layers of the thicknesses here of interest, up to more than 100 nanometers, are transparent. In this connection, it is convenient as a matter of manufacture to form the colored layer on the carrier by spreading or rolling on a pigment bearing layer or film. As a rule it is advantageous to apply the corrosion inciting material next on top of the colored layer and only then to apply the metal layer on top, carrying out these steps by vapor deposition in vacuum in immediate succession.

It is effective as a process to vapor-deposit the corrosion inciting material through a fine mesh screen having particular regions filled in after the manner of currently used screen printing processes. The spacing between the screen plane and the substrate surface during vapor deposition of the corrosion inciting material must be set at such a value that no projection replica of the screenwork results and that instead, with the help of penumbra, the surface of the substrate behind the portions of the screen which are not filled in is coated with the corrosion inciting material.

For carrying out the process, it has been found successful to use an apparatus having an apertured roll for depositing, from vapor produced inside the roll, spots or areas of the corrosion inciting material followed by an exposure roll with the same surface velocity as the aperture roll adapted to carry the carrier with its deposit of corrosion inciting material disposed outwardly around the exposure roll, past a window member through which the metal layer is deposited from vapor. In such an arrangement, it is appropriate to enclose both rolls and their related vapor deposition means in a single vacuum maintaining enclosure. The apertures of the aperture roll can be arranged in a pattern without disturbances produced by interrupting webs.

Illustrative embodiments of the methods, apparatus and products of the invention are further described with reference to the accompanying drawings in which:

FIG. 1 is a schematic representation of an experimental apparatus for carrying out the process of the invention;

FIGS. 2a and 2b respectively show cross-sections of the vapor deposited layer according to the invention before and after the formation of oxidized regions;

Figure 1:
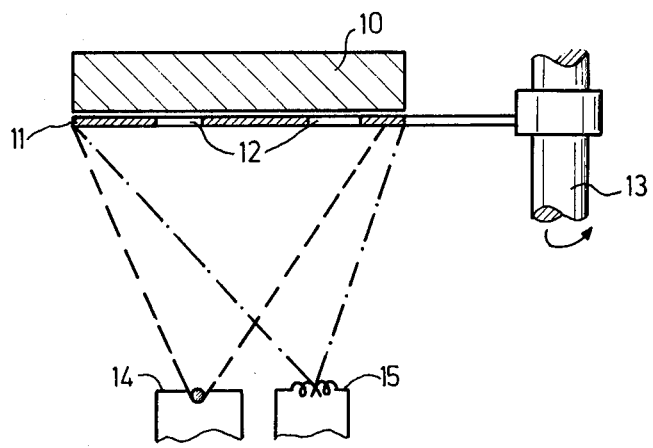

In FIG. 1 is shown a carrier 10 covered by a mask or diaphragm 11 having openings or perforations 12. The mask is pivoted on a holder 13, so that it may be swung in or out of position.

On the side of the mask 11, away from the carrier 10, are arranged a first vaporizer 14 and a second vaporizer 15. The openings 12 in the mask 11 lie at places where the vapor deposited layer should not be visible in the finished pattern.

In order to produce oxidized areas disposed in a pattern, a material is vapor deposited from the vaporizer 14 through the openings 12 onto the carrier which will later incite local corrosion of the final vapor deposited layer. Bismuth and sodium were among the materials utilized for this purpose in experiments carried out in this manner. The mask 11 is then removed, which in the apparatus shown in FIG. 1 is done by a simple sideways rotation arrangement. Thereafter, the entire surface of the carrier facing the two vaporizers is coated, by vapor deposition from the second vaporizer 15, with the actual metallizing layer. In the experiments carried out, aluminum was used as the metallizing metal.

Figure 2A:
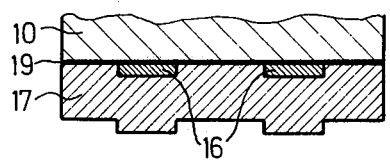

The steps just described result in the layer structure shown in FIG. 2a, in which on the carrier 10 there are spots of corrosion inciting material 16 and over that a metal layer 17. The corrosion inciting material is, in this case, bismuth and the metal layer is of aluminum.

Experiments have shown that with approximately the same results, an inversion of the sequence of steps is possible. Thus, the metal layer can be vapor deposited first and only thereafter the corrosion inciting material. When aluminum is used as the metal layer, the evacuated experimental apparatus should not be opened to the admission of air between the two steps, because in such case the aluminum surface will be covered, as the result of atmospheric oxidation, with an oxidized layer having a strongly corrosion limiting effect.

The pressure in the evacuated vapor deposition apparatus is less than $10^{-4}$ torr. Immediately upon removal of the coated carrier from the evacuated apparatus or after a certain reaction time depending upon the kind and quantity of material, the layer structure has the composition shown in FIG. 2b. For the combination of bismuth as corrosion inciting material and aluminum as metallizing layer, the reaction is completed after about 20 seconds after the aeration of the apparatus.

Figure 2B:
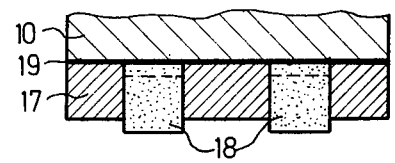

As shown in FIG. 2b, the metal layer 17 remains unchanged at the location not occupied by the corrosion inciting material 16, while at the places where the corrosion inciting material 16 was laid down an invisible transparent layer 18 is formed. The oxides and reaction products of the layer reaction produced in these places have a high electrical resistance and, in the layer depth deposited from vapor, are transparent. Because of this high insulation resistance, the reaction products are believed to include chiefly mixed or combined oxides of the vapor deposited materials.

Figure 3:
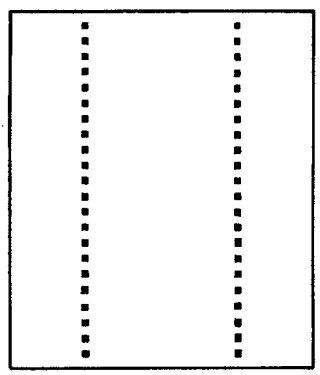
FIG. 3 is a plan view of a piece of metallized paper provided with a raster pattern for registration purposes.

In this manner, a pattern can be produced on a non-metallic substrate which, in addition to possessing differentiation by electrical properties in comparison to those of the metal layer, also possess good optical contrast determined by the optical properties of the surface. In order to emphasize the pattern more clearly, either the carrier itself can be dyed or otherwise colored or, as here illustrated, a pigment bearing organic covering medium can be spread or rolled onto the carrier 10 to form the layer 19. This layer, which may conveniently be black as shown in FIG. 3, is clearly visible in sharply defined areas corresponding to the pattern in which the corrosion inciting material was originally laid down, as a result of the conversion of the vapor deposited materials in those locations. The vapor deposited aluminum layer 17 and the corrosion inciting layer 16 are invisible at these locations and allow the pigment layer to be seen through them.

The electrical properties of the metallic layer 17 and of the transparent layer 18 are also strongly differentiated from each other. The resistance of the transparent layer 18 is so high that paths formed by this layer can take on the role of electric insulation isolating portions of the metallic layer.

The following example of a thin film structure according to the invention was experimentally tested and measured:

On a glass substrate 75 mm long and 25 mm wide bismuth strips 25 mm long, 0.4 mm wide and about 20 nm thick were vapor deposited in accordance with the invention through a diaphragm having a number of slits each 0.4 mm wide. The diaphragm was then removed and the entire substrate surface was coated with a 50 nm thickness of vapor deposited aluminum. The 25 mm long and 0.4 mm wide oxidized regions in the aluminum layer produced by induced corrosion were found to possess electrical resistance, measured in air, of far more than 100 megohms.

Figure 4:
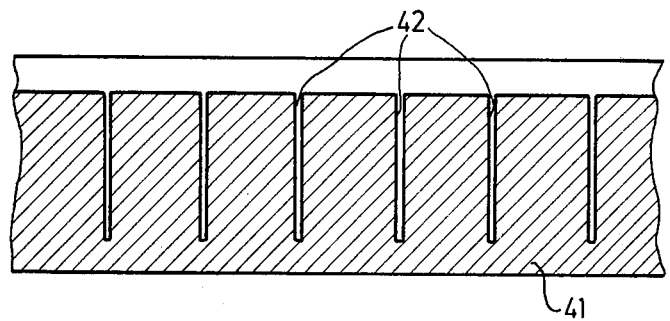
FIG. 4 is a plan view of metallized paper provided with a conduction pattern suitable for a pulsing capacitor.

This process is particularly well suited for the manufacture of insulating strips or webs in metallized paper capacitors. Pulsing capacitors for high voltages provide an example of this application of the process. In such capacitors, it is necessary to take care to assure that the energy liberated by self-healing phenoma remains limited. FIG. 4 shows an example of metallized paper designed to take care of that problem. The metallizing layer 41 is in that case subdivided by insulating strips 42 into a sort of comb composed of many capacitor elements linked together. By this subdivision, the energy developed by a short circuit is reduced and the damage or destruction of the dielectric is prevented.

Figure 5:
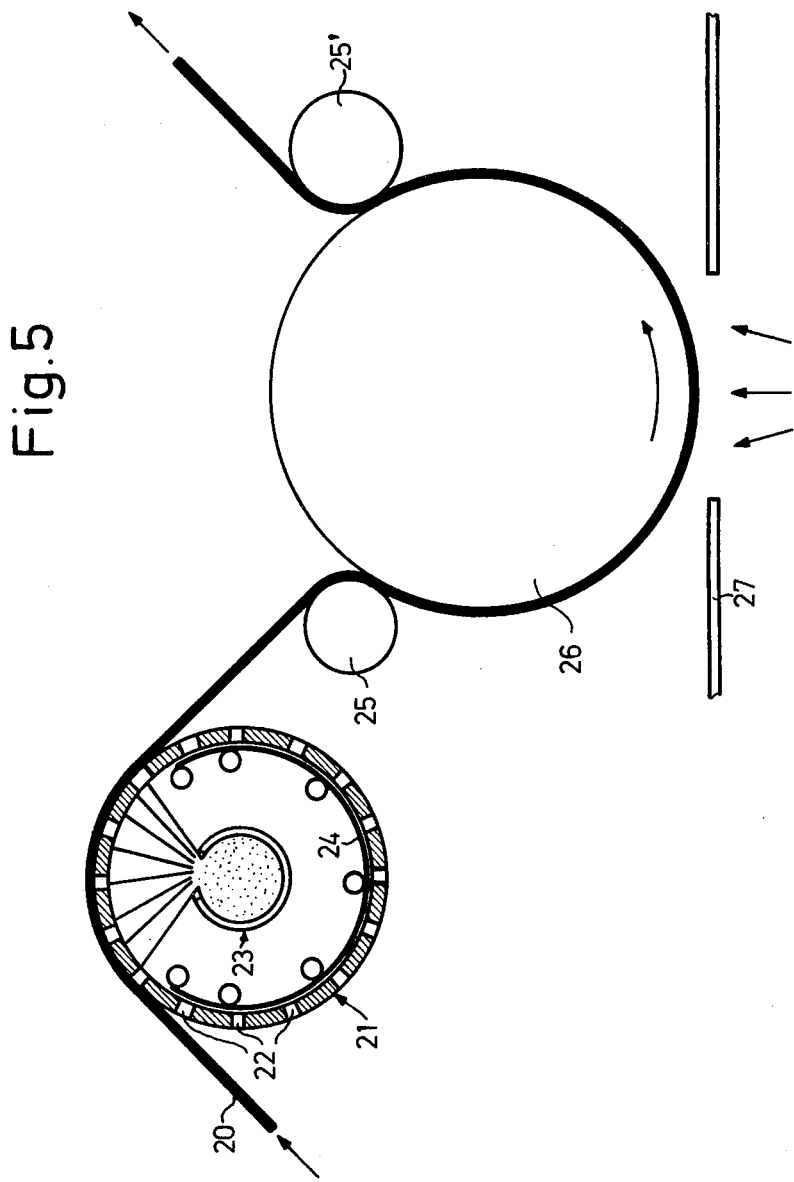
FIG. 5 is a diagrammatic cross-section of an apparatus for carrying out a process according to the invention.

Another useful application of the process of this invention is illustrated by the production of a reference margin on an aluminized paper coded information tape in which the reference margin is adapted to be optically followed. The reference margin is formed of a linear array of squares measuring 1.2 mm on an edge, separated by 2.54 mm intervals. Black coated paper of a thickness of 40 $\mu$m is used as a carrier, the coating having a thickness of 1 $\mu$m. A cutting from a strip of such paper is shown in FIG. 3. FIG. 5 shows an apparatus for coating material in the form of tape in accordance with the invention.

The paper tape 20, which is to be vapor coated, is previously provided with a pigment layer applied by spreading or rolling. It is loaded into a vapor deposition apparatus that operates in a vessel in which a vacuum can be established and maintained. The paper runs first over a roll 21 which has square openings through its periphery spaced in sequence around the roll in a suitable array. Inside of the roll 21 is a vaporizing tube 23 having orifices in the plane of the holes of the roll 21. If more than one raster traces are to be produced at the same time, than two or more planes of holes are provided along side of each other.

Inside of the evaporation tube 23, which may be either directly or indirectly heated, a constant level of bismuth vapor pressure is maintained during the entire vapor deposition operation. The vapor pressure is so high that a bismuth accumulation of 2 $\mu$g/cm$^2$ is obtained through the square openings 22 of the roll 21. An auxiliary heater 24 provides for the introduction of additional heat where it can best prevent or mitigate condensation of bismuth atoms on the surface of the roll. The paper tape 20 then runs over a first guide roll 25 onto an exposure roll 26 and thereafter over a second guide roll 25'. The exposure roll 26 carries the surface of the tape on which bismuth was deposited (through the openings 22) now opposite a window in a diaphragm 27 through which an aluminum layer is vapor deposited on tha tape under the usual vapor deposition conditions. The source of aluminum vapor is not shown in FIG. 5. The amount of aluminum deposition amounts to 10 $\mu$g/cm$^2$.

The metallized paper tape 20 is then wound up on a takeup roll (not shown) in the apparatus. After removal from the vapor deposition apparatus and in part even while the product is still within the apparatus, the reaction begins. In the case of unhindered air access, the metal layer at the places where bismuth was laid down is transfcrmed after 30 seconds. In the wound-up takeup roll, the reaction time is, according to the conditions, slightly lengthened. The end product of the reaction is transparent, so that the black background of the pigmented organic coating is visible. The contrast is excellent and the edges are sharp, so that the requirements for optical detection and matching up are fulfilled.

A very rapid layer conversion in the case of an aluminum layer can also be obtained if a thin sodium layer is used instead of bismuth. In an experiment carried out with vapor deposition of such a sodium layer, density of deposition of about 3 $\mu$g/cm$^2$ was observed. On the finished patterned metallized paper, practically no difference between the effect of sodium and that of bismuth can be recognized.

Figure 6:
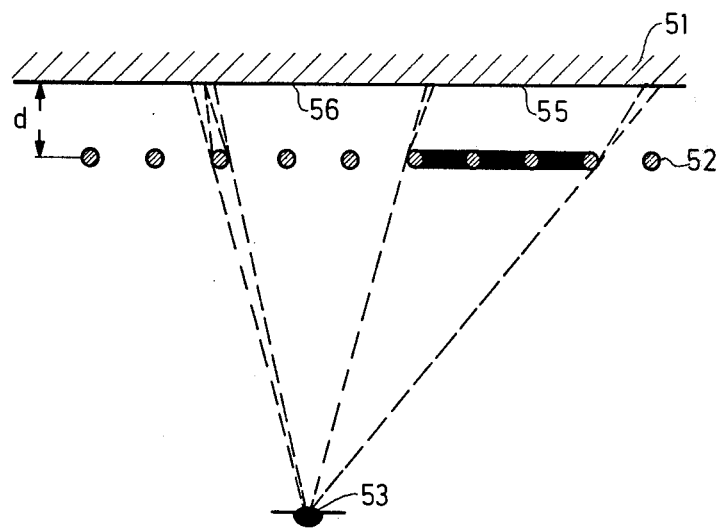
FIG. 6 is a diagrammatic cross-section of another apparatus for carrying out a process according to the invention.

FIG. 6 shows another apparatus for carrying out the process of this invention. In front of the substrate 51 is located a fine mesh screen 52 with a mesh width of 40 $\mu$m. An area 54 of the screen 52 comprising many apertures of the screen is covered by an organic filling such as is used in screen printing. At this location, the metal layer should later be preserved. Following the process of this invention, a thin bismuth layer of 2 $\mu$g/cm$^2$ is now first vapor deposited through the screen from a vapor source 53. The screen is then removed and the entire surface vapor coated with about 10 $\mu$g/cm$^2$ of aluminum. After exposure to air and completion of the reaction, the marks imposed by the covering 54 are visible. The variation of the appearance of the background in the regions 56 produced by change of the spacing d between the screen 52 and the surface of the substrate 51 is an important touchstone of this form of the process. If this spacing is very small, for example smaller than 1 mm, the projection fidelity of the process is so high that a raster is produced exactly corresponding to the geometrical dimensions of the screen from which the characters or other contours provided by the covered areas 54 are set off. If the separation $d$ is increased, an increasing fuzziness is produced on account of the fact that the vapor source 53 is not a point source but has finite dimensions, thus producing penumbra regions that meet at a certain minimum separation, while at the same time reflection and scattering of the vapor atoms also reduces the sharpness and depth of shadows. A distance is soon reached at which the entire area 56 is covered with a bismuth layer, even though of somewhat varying thickness. Since for the process of this invention, however, a wide range of acceptable density of bismuth layer is available, it is possible to obtain the result that the background pattern corresponding to the screen characteristics practically disappears, for the oxide formed over the whole surface region 56 is transparent. The places more thinly coated with the corrosion inciting agent located directly behind the screen filaments do not show up in practice because the oxidation reaction is independent within wide limits of the amount or density of the oxidation promoting material.

The process of this invention has a copying fidelity that, in practice, is limited only by the vapor deposition conditions. With this process, oxide-metal patterns may be produced in size ranges that are not feasible with other processes such as, for example, direct vapor deposition of oxide, reactive vapor treatment and anodic oxidation. A particular advantage of the process of the invention lies in the fact that it can be carried out in a single vapor processing stage at small technical and time cost.

The application of the new process is, however, by no means limited to the illustrated examples. Just as the optical qualities of the reaction product may be used for the production of patterns in vapor deposited layers, their mechanical, electrical and dielectric properties can likewise be utilized for technically significant purposes. For example, utilization as a mechanical protective layer and finally use as a dielectric in thin film capacitors are to be considered.

We claim:

1. A method of producing a visibly patterned metal layer supported on a carrier which comprises the steps of:

vapor-depositing a layer of a first metal under vacuum on said carrier substrate, vapor-depositing under vacuum, at selected locations on said carrier, a second metal having corrosion inciting properties with respect to the first metal, such as to promote the formation of corrosion products of said first metal at said locations, and then exposing the metal layer on said carrier to an oxidizing atmosphere to produce at said selected locations modified portions of the metal layer remaining fixed on said carrier and having characteristics readily distinguishable optically from unaffected portions of said metal layer, the two aforesaid metal layer deposition steps being performed successively in the order above set forth under continued maintenance of vacuum.

2. A method of producing a visibly patterned metal layer as defined in claim 1 in which said first metal is aluminum and said second metal is selected from the group consisting of bismuth and sodium.

3. A method as defined in claim 1 in which said second metal (16) is vapor-deposited through a fine mesh screen (52) having particular regions thereof filled in as for a screen printing process.

4. A method as defined in claim 3 in which the spacing between the plane of said screen and the surface of said substrate during the vapor-deposition of said second metal (16) is sufficient for said second metal (16) to reach the surface of said substrate behind the meshes of said screen but insufficient to allow said second metal to reach the surface of said substrate behind filled-in regions of said screen.

5. A method of producing a visibly patterned metal layer supported on a carrier which comprises the steps of:

applying a colored layer to a carrier substrate, vapor-depositing a metal layer under vacuum on said carrier substrate, vapor-depositing under vacuum at selected locations on said carrier substrate a corrosion inciting material adapted to cause the formation of corrosion products of said metal at said locations, and then exposing said metal layer to an oxidizing atmosphere to produce at said locations modified portions of said layer remaining fixed on said carrier substrate and having characteristics readily distinguished optically from unaffected portions of said metal layer, said two vapor-depositing steps being performed after the application of said colored layer to said carrier substrate and being performed successively in the order above set forth, the thickness and materials of said vapor-deposited metal and corrosion inciting material being so chosen that said colored layer is visible through the corrosion products formed as aforesaid.

6. A method as defined in claim 5 in which said colored layer is applied to said carrier substrate (10) by spreading or rolling on of a pigment bearing layer (19).

7. A method as defined in claim 5 in which following the application of said colored layer to said carrier substrate, the vapor-deposition in vacuum of said metal layer and then the vapor-deposition in vacuum thereon of said corrosion inciting material are carried out in immediate succession.

8. A method of producing a visibly patterned metal layer as defined in claim 5 in which said metal layer is a layer of aluminum and in which said corrosion inciting material is selected from the group consisting of bismuth and sodium.

9. A method of producing a visibly patterned metal layer supported on a carrier which comprises the steps of:

vapor-depositing under vacuum, at selected locations on said carrier, a layer of a first metal, vapor-depositing on said carrier substrate a layer of a second metal so as to cover both said selected locations on said carrier where said first metal has already been deposited and also portions of the surface of said carrier lying between said selected locations, said first metal having corrosion inciting properties with respect to the second metal, and then exposing the metal layer on said carrier to an oxidizing atmosphere to produce at said selected locations modified portions of the metal layer remaining fixed on said carrier and having characteristics readily distinguishable optically from unaffected portions of said metal layer, the two aforesaid metal layer deposition steps being performed successively in the order above set forth under continued maintenance of vacuum.

10. A method of producing a visibly patterned metal layer as defined in claim 9 in which said first metal is selected from the group consisting of bismuth and sodium and said second metal is aluminum.

11. A method as defined in claim 9 in which said first metal is vapor-deposited through a fine mesh screen (52) having particular regions thereof filled in as for a screen printing process.

12. A method as defined in claim 11 in which the spacing of said screen and the surface of said substrate during the vapor-deposition of said first metal is sufficient for said first metal to reach the surface of said substrate behind the meshes of said screen, but insufficient to allow said first metal to reach the surface of said substrate behind filled-in regions of said screen.

13. A method of producing a visibly patterned metal layer supported on a carrier which comprises the steps of:

applying a colored layer to a carrier substrate, vapor-depositing a first metal under vacuum at selected locations on said carrier substrate, vapor-depositing a second metal layer under vacuum on said carrier substrate covering both said selected locations where said first metal has already been deposited and also the surface of said carrier substrate lying between said selected locations, said first metal being a corrosion inciting material able to promote the formation of corrosion products of said second metal at said locations, and then exposing said metal layer to an oxidizing atmosphere to produce at said locations modified portions of said layer remaining fixed on said carrier substrate and having characteristics readily distinguishable optically from unaffected portions of said metal layer, the two vapor-depositing steps being performed after the application of said colored layer to said carrier substrate and being performed successively in the order above set forth, the thickness and composition of said vapor-deposited metal layers being so chosen that said colored layer is visible through the corrosion products formed as aforesaid.

14. A method as defined in claim 13 in which following the application of said colored layer to said carrier substrate, the vapor-deposition in vacuum of said first metal (16) and then the vapor-deposition in vacuum thereon of said second metal layer (17) are carried out in immediate succession.

15. A method as defined in claim 13 in which said colored layer is applied to said carrier substrate (10) by spreading or rolling on of a pigment bearing layer (19).

16. A method of producing a visibly patterned metal layer as defined in claim 13 in which said first metal is selected from the group consisting of bismuth and sodium and in which said second metal is aluminum.

* * * * *